(12) United States Patent
Cong

(10) Patent No.: US 7,915,925 B2
(45) Date of Patent: Mar. 29, 2011

(54) SCANNABLE D FLIP-FLOP

(75) Inventor: Gaojian Cong, Shanghai (CN)

(73) Assignee: NVIDIA Corporation, Santa Clara, CA (US)

( * ) Notice: Subject to any disclaimer, the term of this patent is extended or adjusted under 35 U.S.C. 154(b) by 45 days.

(21) Appl. No.: 12/270,060

(22) Filed: Nov. 13, 2008

(65) Prior Publication Data

US 2010/0083064 A1 Apr. 1, 2010

(51) Int. Cl.
*H03K 19/096* (2006.01)
(52) U.S. Cl. .............. 326/95; 326/46; 326/98; 327/218; 327/208
(58) Field of Classification Search .................... 326/46, 326/95, 98; 327/218, 215, 208
See application file for complete search history.

(56) References Cited

U.S. PATENT DOCUMENTS 7,345,519 B2 * 3/2008 Hirata ............................ 327/208
7,596,732 B2 * 9/2009 Branch et al. ................. 714/726

OTHER PUBLICATIONS

N. Nedovic and V.G. Oklobdzija, "Dynamic Flip-Flop With Improved Power," Proceedings of the IEEE International Conference on Computer Design: VLSI in Computers and Processors (ICCD'00), 2000, pp. 323-326.

DeJan Markovic, Borivoje Nikolic and Robert W. Brodersen, "Analysis and Design of Low-Energy Flip-Flops," ISPLED'01, Aug. 2001, pp. 52-55.
R. Ramanarayanan, N. Vijaykrishnon and M.J. Irwin, "Characterizing Dynamic and Leakage Power Behavior in Flip-Flops," ASIC/SOC Conference, 2002. 15$^{th}$ Annual IEEE International, 2002, pp. 433-437.
T. Hanyu, A. Mochizuki and M. Kameyama, "Multiple-Valued Dynamic Source-Coupled Logic," Proc. 33$^{rd}$. IEEE International Symposium on Multiple-Valued Logic, May 16-19, 2003, pp. 207-212.

* cited by examiner

*Primary Examiner* — Daniel D Chang
(74) *Attorney, Agent, or Firm* — Patterson & Sheridan, LLP

(57) ABSTRACT

The present invention relates to scannable D flip-flops, which are improved to solve the problem of the conventional designs and provides a small and fast scannable D flip-flop without compensating its testability. The embodiment of the present invention provides a scannable D flip-flop, comprising a source coupled logic, comprising a trigger circuit for reading a clock input; a scannable input circuit coupled to the trigger circuit having four NMOS transistors; a first feedback circuit for a first output; and a second feedback circuit for a second output; a latch circuit coupled to the source coupled logic; and an output buffer coupled to the latch circuit. Another embodiment of the present invention provides a scannable D flip-flop, comprising: a cascade dynamic logic, comprising: a first stage circuit; a second stage circuit coupled to the first stage circuit; a third stage circuit coupled to the second stage circuit; and a scannable input circuit coupled to the first stage circuit having four NMOS transistors for reading a data input and scannable inputs; a latch circuit coupled to the second stage circuit; and an output buffer coupled to the latch circuit.

26 Claims, 9 Drawing Sheets

SCANNABLE D FLIP-FLOP

CROSS-REFERENCE TO RELATED APPLICATIONS

This application priority to Chinese patent application serial number 200810168567.4, filed Sep. 26, 2008, which is herein incorporated by reference.

FIELD OF THE INVENTION

The present invention relates to a D flip-flop; more specifically, the present invention relates to a scannable D flip-flop.

BACKGROUND OF THE INVENTION

The most basic design of a memory unit is a D flip-flop, which data can be written into or read from. The D flip-flop has two inputs, and they are clock (CLK) and data (D). And the D flip-flop has one output, which normally has a notation Q. When designing the D flip-flop, several requirements are taken into consideration. The most critical of all will be the time efficiency. Please refer to FIG. 1, which illustrates a timing diagram of a typical D flip-flop. Obviously, it is desirable to minimize the $T_{setup}$, $T_{hold}$ and $T_{clk-q}$ to ensure the time efficiency of the design. A plurality of D flip-flops are constructed to form a pipeline with combinational logics. A typical pipeline circuit comprises two D flip-flops and a combinational logic; and the performance of an IC can be significantly improved by ensuring the time efficiency of the D flip-flops. Furthermore, with the fact that the design geometries continue to shrink, it is also important to take the area into consideration when designing a D flip-flop while keeping power dissipation at minimum.

Several attempts have been done to improve the performance and functionality of D flip-flops. A conventional master-slave flip-flop (also shown in Table 1) has a low power dissipation and negative $T_{hold}$ but large $T_{setup}$. A conventional sense-amplifier flip-flop has a small $T_{setup}$ but occupies a large area. A conventional semi-dynamic flip-flop has a small $T_{setup}$ and $T_{clk-q}$; however it takes large clock power and has a large $T_{hold}$. A conventional hybrid latch flip-flop, which also dissipate large power and has a large $T_{hold}$. In view of the above, none of the prior art designs of the D flip-flop has met the needs of the requirements.

Today, with the explosive growth in the availability of complex IC devices, it is also apparent that careful consideration should be taken during the component design stage in order to insure adequate testability and producibility of digital ICs. Therefore, the design structure of a D flip-flop is required to provide adequate testability, and such structure of the D flip-flop is called scannable D flip-flop. However, the testability of the D flip-flop scarifies the timing performances. A conventional true-single-phase-clock flip-flop has small $T_{setup}$, $T_{clk-q}$ and $T_{hold}$; however, $T_{setup}$ becomes much larger after incorporating the scan function. When incorporating the scan function, the number of inputs is increased from two to four. Please see FIG. 2, which illustrates the differential input of the conventional scannable D flip-flop design. It can be seen that it requires at least eight transistors for reading differential inputs of data, clock, and inputs for the scan function. With the increase in the number of transistors used, the conventional scannable D flip-flop increases the throughput time, power dissipation and, most importantly, the area on an IC. Adding the scan function for testability makes the D flip-flop slower, larger and more power consuming. Therefore, it is desirable to have a scannable D flip-flop that is smaller and faster without costing its testability.

SUMMARY OF THE INVENTION

An embodiment of the present invention provides a scannable D flip-flop to solve the problem of the conventional designs and provides a small and fast scannable D flip-flop without compensating its testability. The embodiment of the present invention provides a scannable D flip-flop, comprising a source coupled logic, comprising a trigger circuit for reading a clock input; a scannable input circuit coupled to the trigger circuit having four NMOS transistors; a first feedback circuit for a first output; and a second feedback circuit for a second output; a latch circuit coupled to the source coupled logic; and an output buffer coupled to the latch circuit.

To solve the problem of the prior technology, another embodiment of the present invention also provides a scannable D flip-flop, comprising: a cascade dynamic logic, comprising: a first stage circuit; a second stage circuit coupled to the first stage circuit; a third stage circuit coupled to the second stage circuit; and a scannable input circuit coupled to the first stage circuit having four NMOS transistors for reading a data input and scannable inputs; a latch circuit coupled to the source coupled logic; and an output buffer coupled to the latch circuit.

DETAILED DESCRIPTION OF THE INVENTION

Figure 2:
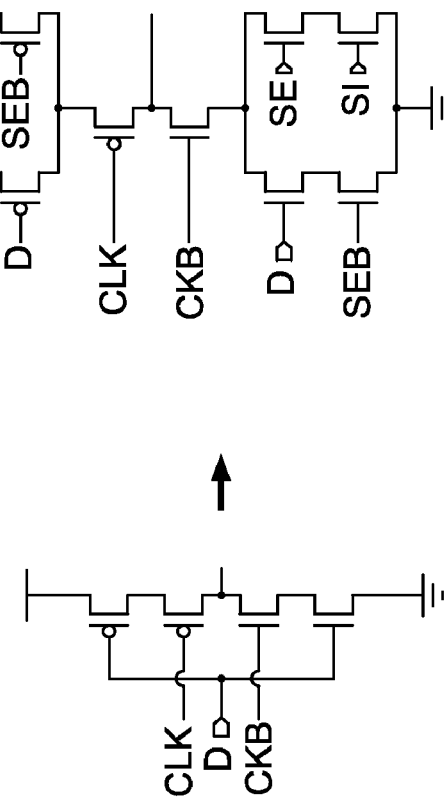
FIG. 2 illustrates the differential input of the conventional scannable D flip-flop design.
Figure 1:
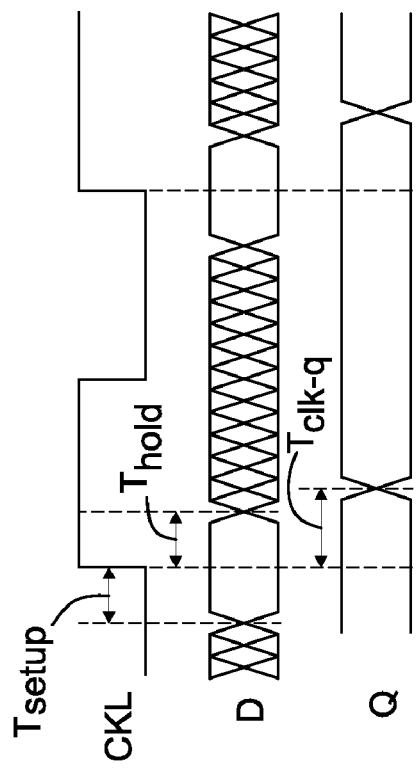
FIG. 1 illustrates a timing diagram of a typical D flip-flop.
Figure 3:
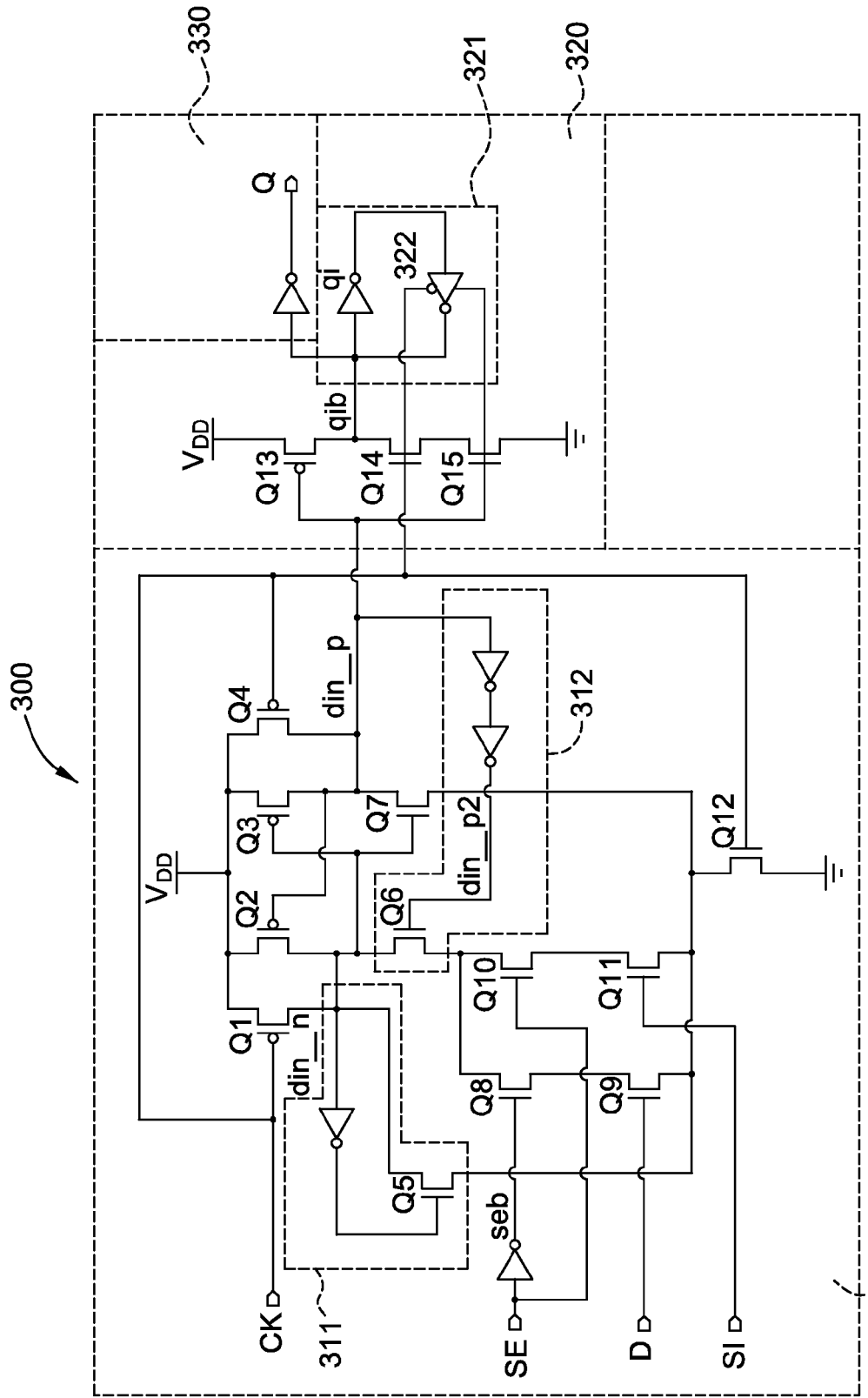
FIG. 3 illustrates the schematic diagram of a scannable source coupled prediction flip-flop according to an embodiment of the present invention.

Referring to FIG. 3, it illustrates the schematic diagram of a scannable source coupled prediction (SCP) flip-flop 300 according to an embodiment of the present invention. Scannable SCP flip-flop 300 comprises a source couple logic 310, a latch circuit 320 and an output buffer 330. Source couple logic 310 further comprises a first feed back circuit 312 for a first output and a second feed back circuit 311 for a second output. In FIG. 1, the first output is noted as din_p whereas the second output is noted as din_n. Latch circuit 320 further comprises a keeper circuit 321 having an inverter and a tristate buffer 322. In source couple logic 310 uses four transistors Q8-Q10 to receive data input (D) and scannable inputs (SE, SI). With such, the scannable SCP flip-flop 300 takes much less room as the conventional design that requires at least eight transistors to receive differential inputs. The reduction in the number of transistors also significantly improves the power consumption and time efficiency of scannable SCP flip-flop 300. Output buffer 330 coupled to latch circuit 320 comprises an inverter and outputs Q.

Figure 3A:
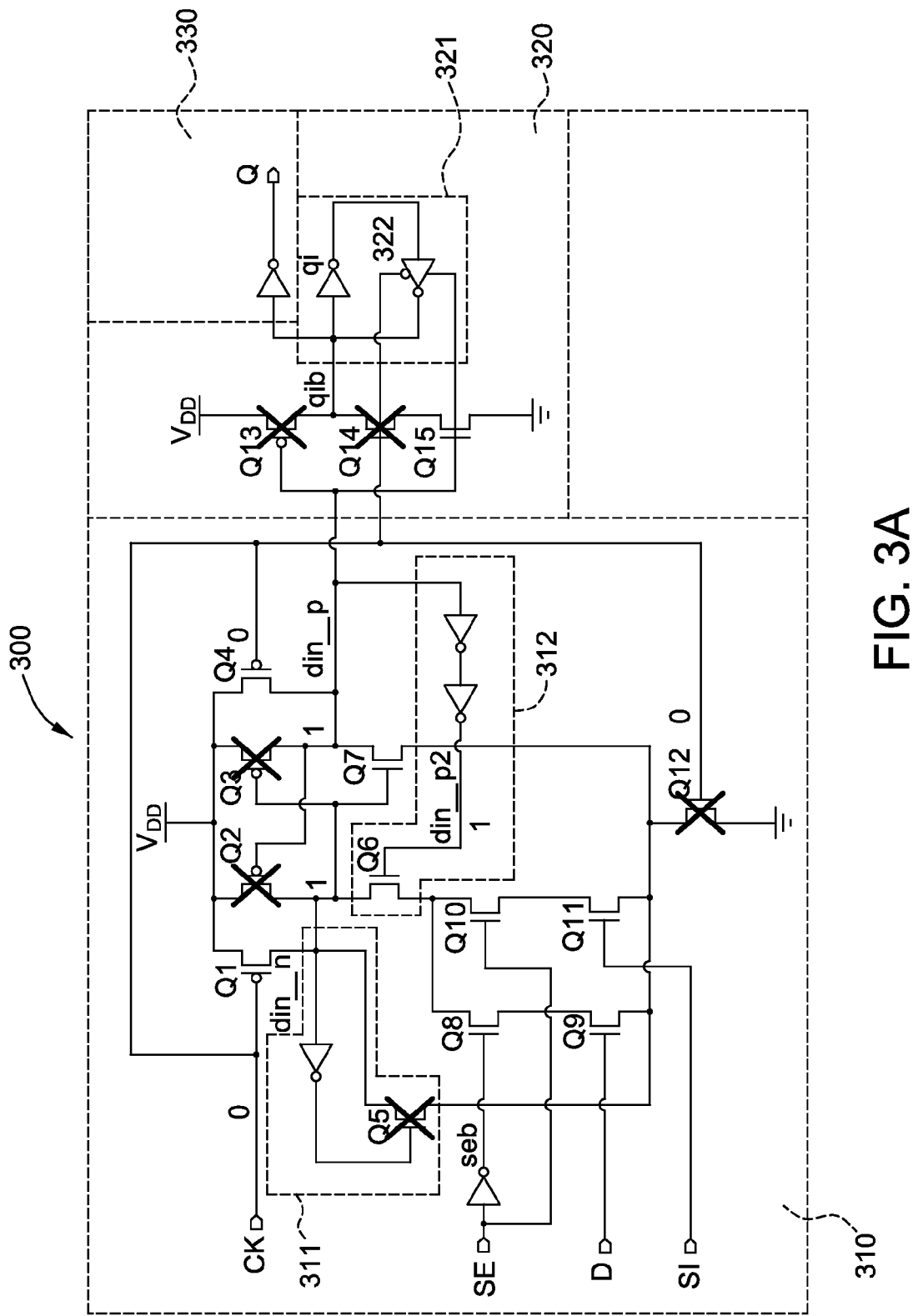
FIG. 3A illustrates the schematic diagram of a scannable source coupled prediction flip-flop of FIG. 3 in the precharge phase.

During operations, scannable SCP flip-flop 300 works in three different phases. The precharge phase of scannable SCP flip-flop 300 is shown in FIG. 3A. In the precharge phase, clock input (CK) is low, which is noted as "0" in FIG. 3A, transistors Q1, Q4, Q6 and Q7 are ON while transistors Q2, Q3, Q5 and Q12 are OFF. Therefore, the first and second outputs of source coupled logic 310 are precharged to be high, which is noted as "1" in the schematic diagram. In latch circuit 320, the transistor Q15 is ON whereas the transistors Q13 and Q14 are OFF. An input of keeper circuit 321 is an output of transistor Q13, which is noted as qib in the schematic diagrams. With both transistors Q13 and Q14 being OFF, qib and qi in keeper circuit 321 stay constant. Similarly, an output Q of scannable SCP flip-flop also stays constant.

Figure 3B:
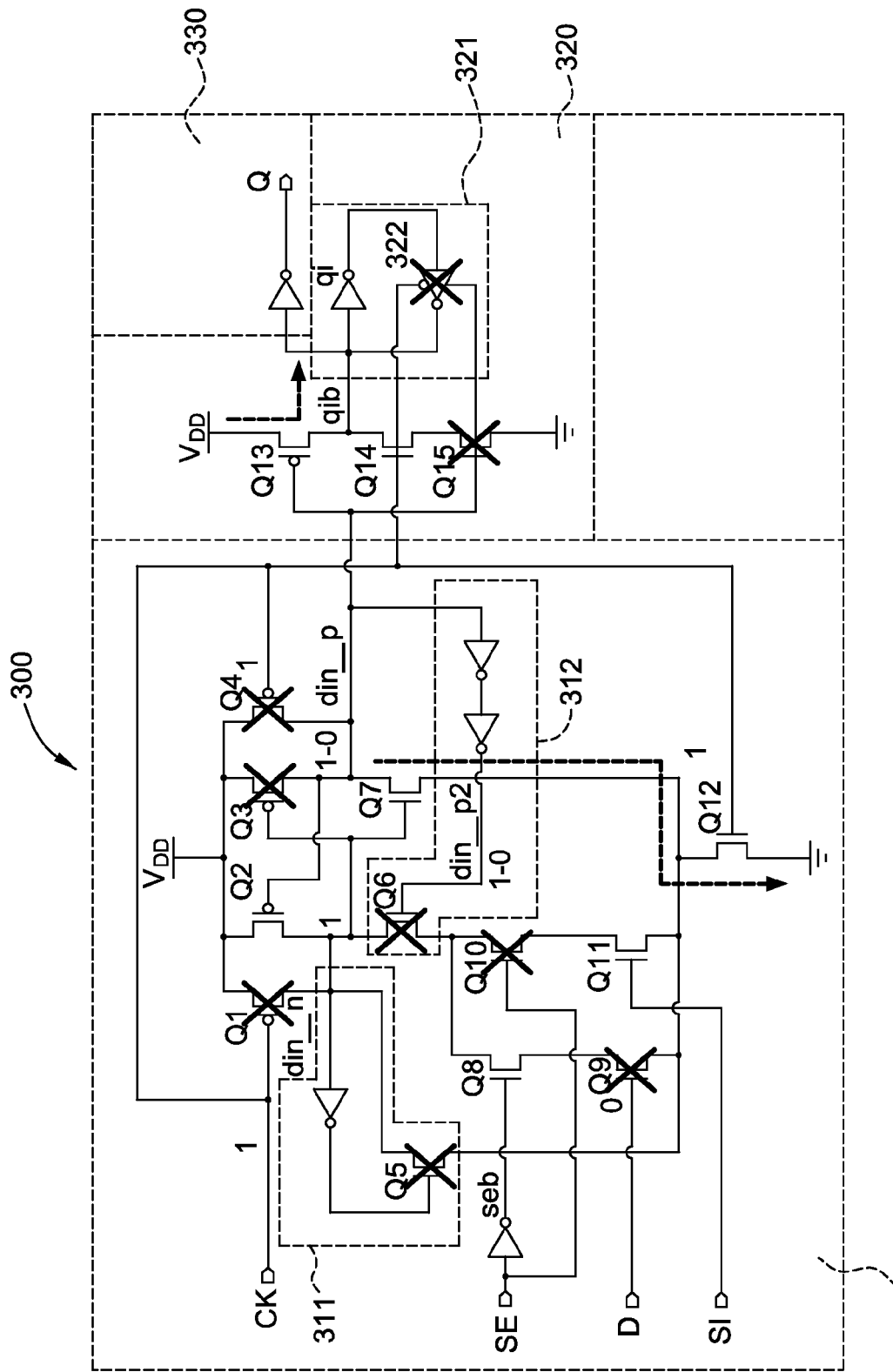
FIG. 3B illustrates the schematic diagram of a scannable source coupled prediction flip-flop of FIG. 3 in the first evaluation phase.

When the clock input raises and the data input is low ("0"), scannable SCP flip-flop 300 enters a first evaluation phase. Please refer to FIG. 3B. FIG. 3B shows scannable SCP flip-flop 300 in the first evaluation phase. In the first evaluation phase, source couple circuit 310 has transistors Q1, Q3 and Q4 turned OFF and transistors Q2 and Q7 turned ON, which makes din_n evaluate to high ("1") and din_p evaluate to low ("0"). As the data input is low, transistor Q9 is turned OFF. The first output din_p is pulled down through transistors Q7 and Q12; while the second output din_n stays high as transistor Q5 is OFF. Din_p2 is a delayed din_p and turns off Q6, which blocks the left pulling down path. If D raises after the clock's raising edge, data in the flop will not be contaminated. Both the first output din_p and the clock input CK are coupled to latch circuit 320, wherein transistor Q13 is turned ON and transistor Q15 is turned OFF by the first output of source couple logic circuit 310. Since din_p is low and clock is high, tristate buffer 322 in keeper circuit 321 is turned OFF. The output of Q13 qib is pulled high as Q13 is turned ON, which yields the output Q being low. The $T_{clk-q}$ in the first evaluation phase equals a delay time of three gates.

Figure 3C:
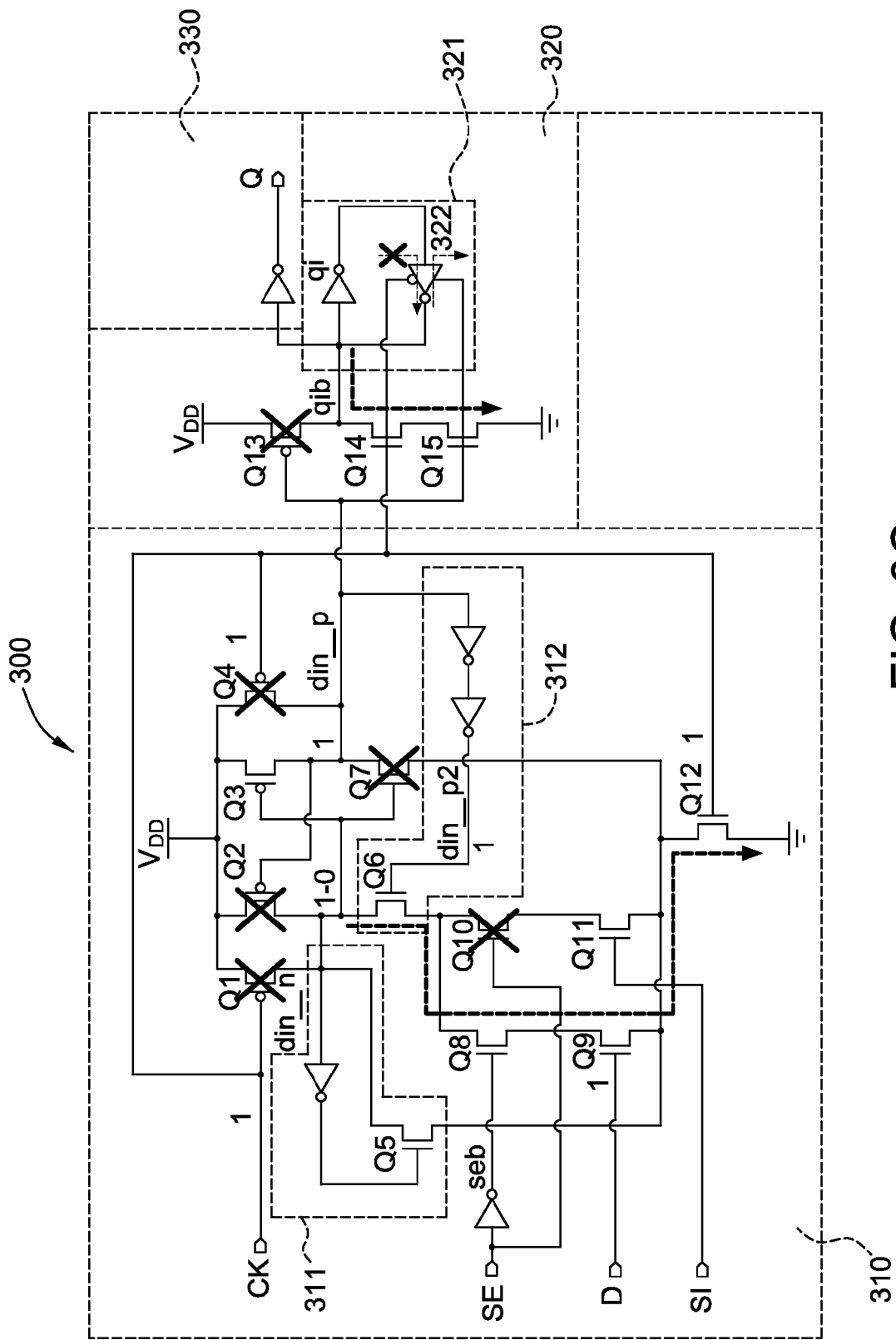
FIG. 3C illustrates the schematic diagram of a scannable source coupled prediction flip-flop of FIG. 3 in the second evaluation phase.

When the clock input raises and the data input is high ("1"), scannable SCP flip-flop 300 enters a second evaluation phase. Please refer to FIG. 3C. FIG. 3C shows scannable SCP flip-flop 300 in the second evaluation phase. In the second evaluation phase, source couple circuit 310 has transistors Q1, Q2 and Q4 turned OFF and transistors Q3 and Q6 turned ON, which makes din_n evaluates to low ("0") and din_p evaluates to high ("1"). As the data input is high, transistor Q9 is ON. The first output din_p stays high and formed a third output din_p2. First feedback circuit 312 comprises two inverters with the purpose of preventing a race between the first output din_p and the second output din_n. The second output din_n is pulled down through the transistors Q6, Q8, Q9 and Q12. Both the first output din_p and the clock input CK are coupled to latch circuit 320, wherein transistor Q13 is turned OFF and transistor Q15 are turn ON by the first output of source couple logic circuit 310. Transistor Q14 receives the clock input and passes it to tristate buffer 322. Qib is pulled low through transistors Q14 and Q15, which sets qi and the output Q to high ("1"), and the $T_{clk-q}$ in the second evaluation phase equals about a delay time of two gates.

Figure 4:
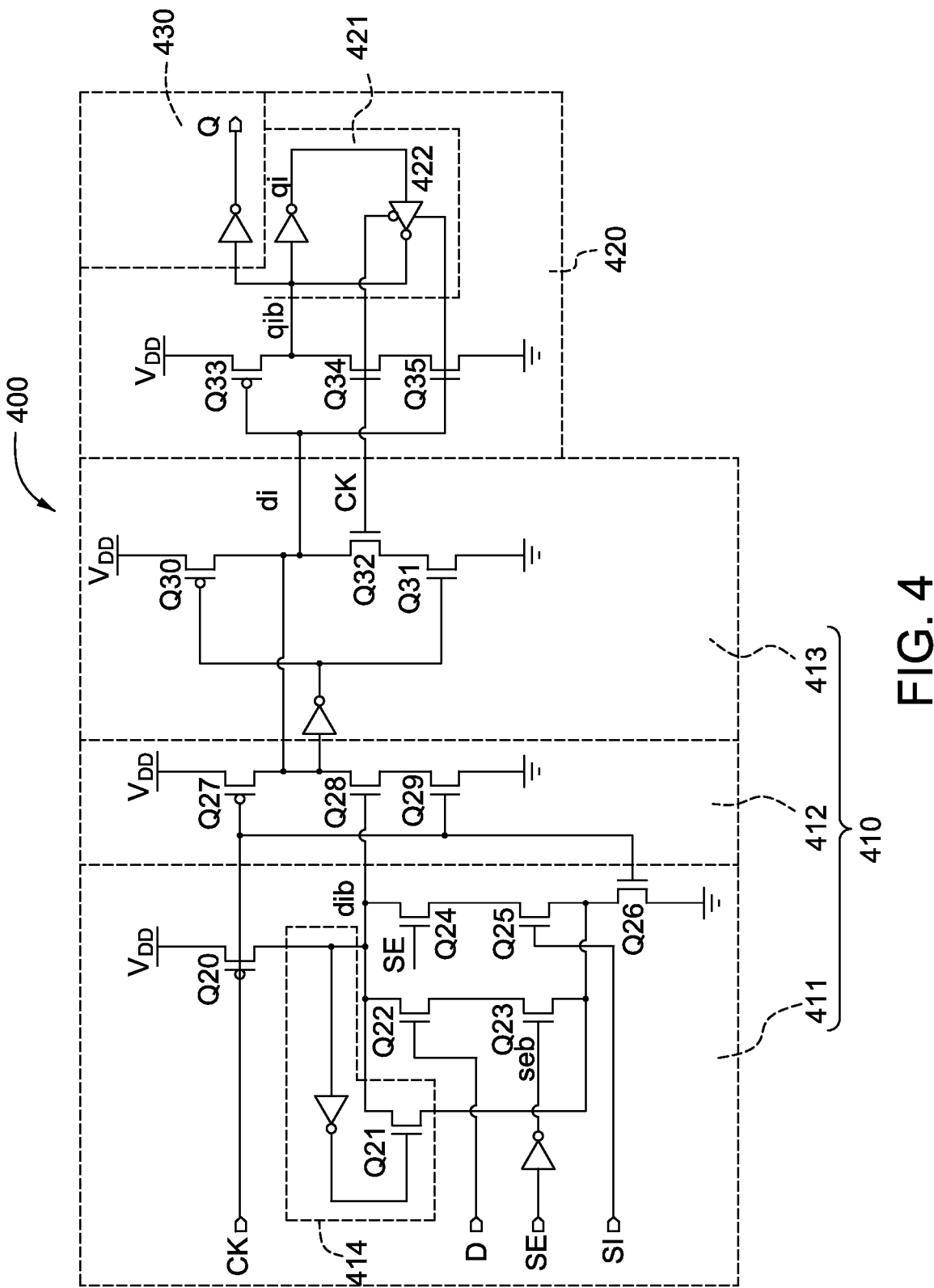
FIG. 4 illustrates a schematic diagram of a scannable cascaded dynamic logic flip-flop according to an embodiment of the present invention.

Another embodiment of the present invention provides a scannable cascaded dynamic logic (CDL) flip-flop. Please refer to FIG. 4, which illustrates a schematic diagram of the scannable CDL flip-flop 400. Scannable CDL flip-flop 400 comprises a cascaded dynamic logic 410, a latch circuit 420 and an output buffer 430. Cascaded dynamic logic 410 further comprises a first stage circuit 411, a second stage circuit 412 and a third stage circuit 413. The first stage circuit 411 uses four transistors Q22-Q25 to receive data input (D) and scannable inputs (SE, SI). With such, the CDL flip-flop 400 takes much less room as the conventional design that requires at least eight transistors to receive differential inputs. The reduction in the number of transistors also significantly improves the power consumption and time efficiency of scannable CDL flip-flop 400. A clock input (CK) of scannable CDL flip-flop 400 is connected to transistor Q20 in first stage circuit 411. First stage circuit 411 also has a feedback circuit 414, which consists of transistor Q21 and an inverter. Second stage circuit 421 comprises transistors Q27-Q29, wherein transistors Q27 and Q29 is connected to the clock input CK whereas transistor Q28 is connected to the output dib of first stage circuit 411. The output of transistor Q27 is passed to third stage circuit 413. Third stage circuit 413 comprises an inverter and transistors Q30-Q32, wherein transistors Q30 and Q31 is connected to the output of transistor Q27 via the inverter. Latch circuit 420 is coupled to third stage circuit 413. Latch circuit uses transistors Q33-Q35 to coupled to the output di of third stage circuit 413 and the clock input CK. Latch circuit 420 further comprises a keeper circuit 421 having an inverter and a tristate buffer 422. Output buffer 430 coupled to latch circuit 420 comprises an inverter and outputs Q.

Figure 4A:
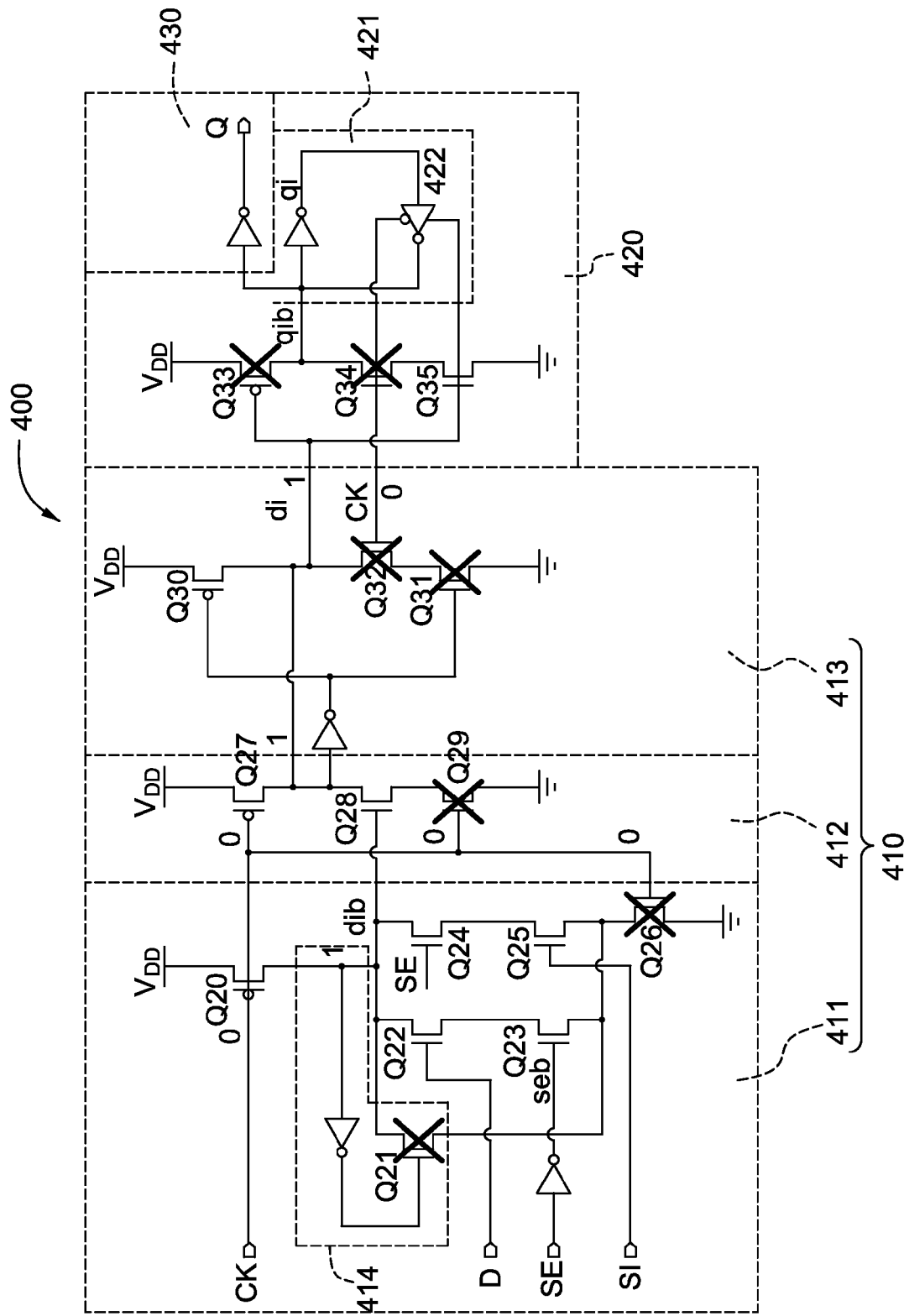
FIG. 4A illustrates the schematic diagram of a scannable cascaded dynamic logic flip-flop of FIG. 4 in the precharge phase.

During operations, scannable CDL flip-flop 400 works in three different phases. The precharge phase of scannable CDL flip-flop 400 is shown in FIG. 4A. In the precharge phase, the clock input (CK) is low, which is noted as "0" in FIG. 4A, transistor Q20 is ON while transistors Q21 and Q26 are OFF. Thus, the output dib is precharged to high, which is noted as "1" in the schematic diagram. In second stage circuit 412, transistors Q27 and Q28 are ON while transistor Q29 is OFF. Subsequently, transistor Q30 is ON in third stage circuit 413, and transistors Q31 and Q32 are OFF. The output di of third stage circuit 413 is also precharged to high in this phase. In latch circuit 420, the transistor Q35 is ON whereas the transistors Q33 and Q34 are OFF. The input of keeper circuit 421 is the output of transistor Q33, which is noted as qib in the schematic diagrams. With both transistors Q33 and Q34 being OFF, qib and qi in keeper circuit 421 stay constant. Similarly, the output Q of scannable CDL flip-flop also stays constant.

Figure 4B:
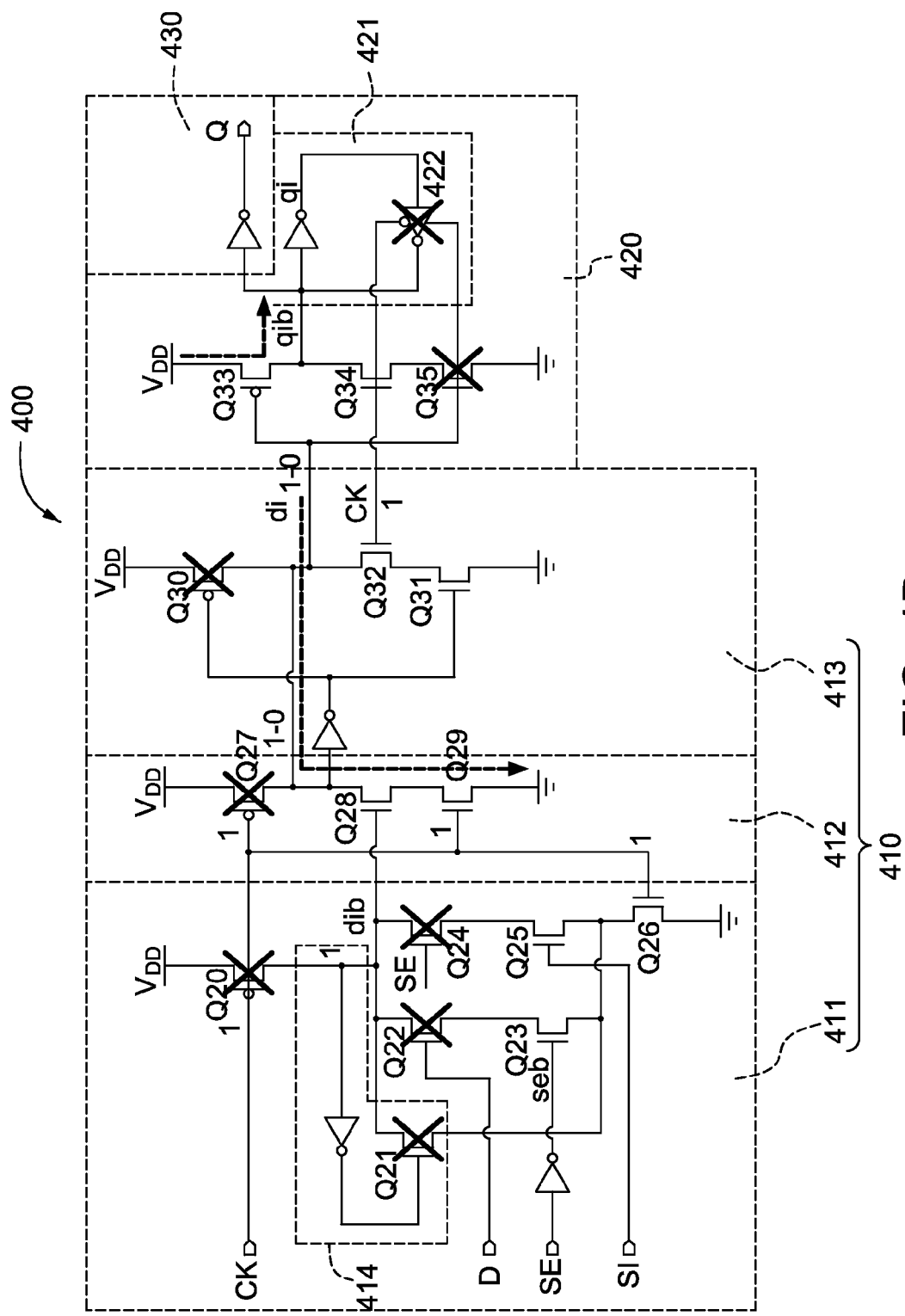
FIG. 4B illustrates the schematic diagram of a scannable cascaded dynamic logic flip-flop of FIG. 4 in the first evaluation phase.

When the clock input raises and the data input is low ("0"), scannable CDL flip-flop 400 enters a first evaluation phase. Please refer to FIG. 4B. FIG. 4B shows scannable CDL flip-flop 400 in the first evaluation phase. In the first evaluation phase, first stage circuit 411 of cascaded dynamic logic 410 has transistors Q20, Q21 and Q22 turned OFF and transistors Q23 and Q26 turned ON, which makes the output dib evaluates to high ("1"). With the clock and the output dib being high, transistor Q27 of second stage circuit 412 is turned OFF and transistors Q28 and Q29 are turned ON. Subsequently, transistor Q30 of third stage circuit 413 is turned OFF, while transistors Q31 and Q32 are ON. The output di is pulled down through transistors Q28 and Q29. Both the output di and the clock input CK are coupled to latch circuit 420, wherein transistors Q33 and Q34 are turned ON and transistor Q35 is turn OFF. Since transistor Q33 is ON, the output of Q33 qib is pulled high and sets qi in keeper circuit 421 to low. The output qib is high, which yields the output Q being low. The $T_{clk-q}$ in the first evaluation phase equals a delay time of three gates.

Figure 4C:
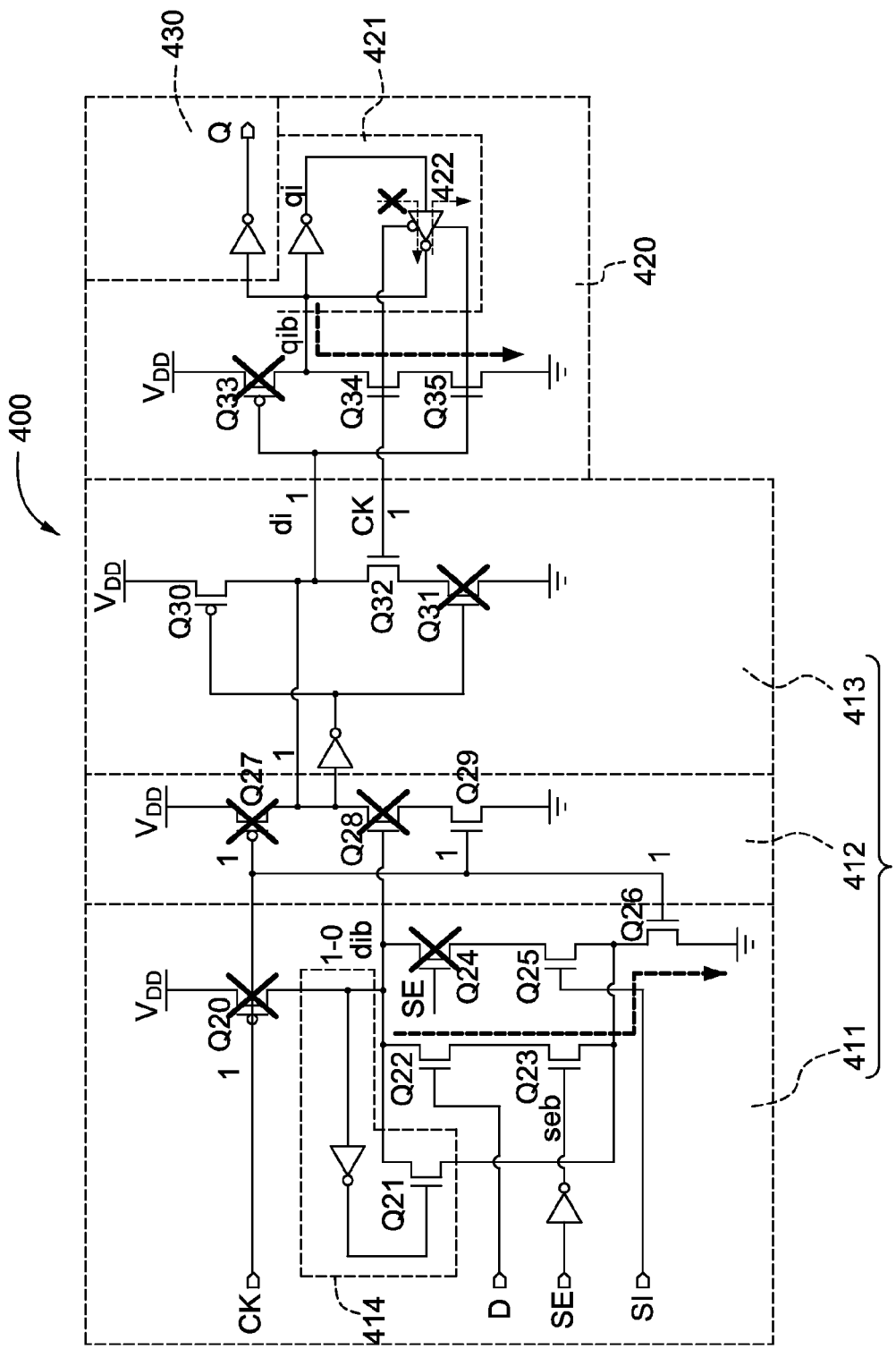
FIG. 4C illustrates the schematic diagram of a scannable cascaded dynamic logic flip-flop of FIG. 4 in the second evaluation phase.

When the clock input raises and the data input is high ("1"), scannable CDL flip-flop 400 enters a second evaluation phase. Please refer to FIG. 4C. FIG. 4C shows scannable CDL flip-flop 400 in the second evaluation phase. In the second evaluation phase, first stage circuit 411 of cascaded dynamic logic 410 has transistor Q20 turned OFF. As the data input is high, transistors Q22, Q23 and Q26 are ON. The output dib is pulled low through transistors Q22, Q23 and Q26. Both the output dib and the clock input CK are coupled to second stage circuit 412 of cascaded dynamic logic 410. Transistors Q27 and Q28 in second stage circuit 412 are OFF whereas transistor Q29 is ON. Coupling to third stage circuit 413, in which transistor Q31 is turned OFF and the output di stays high. The output di and the clock input CK are coupled to latch circuit 420, wherein transistor Q33 is OFF and transistors Q34 and Q35 are ON. Transistor Q34 receives the clock input CK and passes it to tristate buffer 422 of keeper circuit 421. Qib is pulled low through transistors Q34 and Q35, which sets output Q to high ("1"), and the $T_{clk-q}$ in the second evaluation phase equals about a delay time of two gates.

Both embodiments of the present invention have the same area as the conventional master-slave flip-flop. Experiment data from the performance tests is able to prove the proficiency of the embodiments of the present invention in view of the prior art. Table 1 displays the timing and power consumption measurements summarized from the data.

TABLE 1

| | | Master-slave flip-flop | Scannable SCL flip-flop | Scannable CDL flip-flop |
|---|---|---|---|---|
| D = 0 | Q = 0 Power/fJ | 5.89 | 11.27 | 12.39 |
| | Q = 1 $T_{su}$/ps | 69.6 | −32.5 | −22.0 |
| | $T_{cq}$/ps | 121.0 | 103.3 | 84.1 |
| | $T_{hd}$/ps | −39.1 | 58.0 | 48.2 |
| | Power/fJ | 12.76 | 12.35 | 10.74 |
| D = 1 | Q = 0 $T_{su}$/ps | 51.3 | 16.6 | −17.0 |
| | $T_{cq}$/ps | 131.3 | 81.0 | 81.1 |
| | $T_{hd}$/ps | −11.9 | 58.0 | 44.0 |
| | Power/fJ | 15.62 | 15.17 | 15.04 |
| | Q = 1 Power/fJ | 5.83 | 8.03 | 7.22 |

In view of the above, the embodiments of the present invention solve the problem of the prior art. It is proven that the embodiments of the present invention provide much faster scannable D flip-flops.

Although the embodiments disclosed above are discussed in the scope of providing solutions in response to a need for scannable D flip-flops, one of ordinary skill in the art can easily adopt the same circuitry for the providing of other type of purposes. Variations, modifications, and other implementations of what is described herein will occur to those of ordinary skill in the art without departing from the spirit and scope of the present invention as claimed. Accordingly, the present invention is to be defined not by the preceding illustrative description but instead by the spirit and scope of the following claims.

The invention claimed is:

1. A scannable D flip-flop, comprising:
    a source coupled logic, comprising:
        a trigger circuit for reading a clock input;
        a scannable input circuit coupled to the trigger circuit having a plurality of transistors;
        a first feedback circuit for a first output; and
        a second feedback circuit for a second output;
    a latch circuit coupled to the source coupled logic, the latch circuit comprising a PMOS transistor coupled to the first output, a first NMOS transistor coupled to the PMOS transistor, a second NMOS transistor coupled to the first NMOS transistor, and a keeper circuit; and
    an output buffer coupled to the latch circuit.

2. The scannable D flip-flop according to claim 1, wherein the trigger circuit comprises four PMOS transistors and three two NMOS transistors.

3. The scannable D flip-flop according to claim 2, wherein the scannable input circuits has less than eight transistors.

4. The scannable D flip-flop according to claim 1, wherein the scannable input circuit reads a data input and two scannable inputs.

5. The scannable D flip-flop according to claim 1, wherein the first feedback circuit comprises two inverters.

6. The scannable D flip-flop according to claim 1, wherein the second feedback circuit comprises an inverter.

7. The scannable D flip-flop according to claim 1, wherein the clock input couples to the first NMOS transistor.

8. The scannable D flip-flop according to claim 1, wherein the keeper circuit further comprises:
    an inverter coupled to the drain of the PMOS transistor; and
    a tristate buffer coupled to the two NMOS transistor and the inverter.

9. The scannable D flip-flop according to claim 1, wherein the output buffer comprises an inverter.

10. A scannable D flip-flop, comprising:
    a cascade dynamic logic, comprising:
        a first stage circuit;
        a second stage circuit coupled to the first stage circuit;
        a third stage circuit coupled to the second stage circuit; and
        a scannable input circuit coupled to the first stage circuit having a plurality of transistors for reading a data input and scannable inputs;
    a latch circuit coupled to the third stage circuit, the latch circuit comprising a PMOS transistor coupled to an output of the second stage circuit, two NMOS transistors, and a keeper circuit; and
    an output buffer coupled to the latch circuit.

11. The scannable D flip-flop according to claim 10, wherein the first stage circuit comprises:
    a PMOS transistor coupled to a clock input; and
    a feedback circuit.

12. The scannable D flip-flop according to claim 11, wherein the feed back circuit comprises an inverter and a NMOS transistor.

13. The scannable D flip-flop according to claim 10, wherein the second stage circuit comprises a PMOS transistor and two NMOS transistors.

14. The scannable D flip-flop according to claim 10, wherein the third stage circuit comprises an inverter, a PMOS transistor and two NMOS transistors.

15. The scannable D flip-flop according to claim 10, wherein the scannable input circuit has less than eight transistors.

16. The scannable D flip-flop according to claim 10, wherein the clock input couples to one of the NMOS transistors.

17. The scannable D flip-flop according to claim 10, wherein the keeper circuit further comprises:
    an inverter coupled to the drain of the PMOS transistor; and
    a tristate buffer coupled to the two NMOS transistors and the inverter.

18. The scannable D flip-flop according to claim 10, wherein the output buffer comprises an inverter.

19. A scannable D flip-flop, comprising:
  a source coupled logic, comprising:
    a trigger circuit for reading a clock input, the trigger circuit comprising four PMOS transistors and two NMOS transistors;
    a scannable input circuit coupled to the trigger circuit having a plurality of transistors;
    a first feedback circuit for a first output; and
    a second feedback circuit for a second output;
  a latch circuit coupled to the source coupled logic; and
  an output buffer coupled to the latch circuit.

20. The scannable D flip-flop according to claim 19, wherein the scannable input circuits has less than eight transistors.

21. The scannable D flip-flop according to claim 19, wherein the scannable input circuit reads a data input and two scannable inputs.

22. The scannable D flip-flop according to claim 19, wherein the first feedback circuit comprises two inverters.

23. The scannable D flip-flop according to claim 19, wherein the second feedback circuit comprises an inverter.

24. The scannable D flip-flop according to claim 19, wherein the clock input couples to a first NMOS transistor that forms a portion of the latch circuit.

25. The scannable D flip-flop according to claim 19, wherein the latch circuit includes a keeper circuit that comprises:
  an inverter coupled to the drain of a PMOS transistor that forms a portion of the latch circuit; and
  a tristate buffer coupled to the a first NMOS transistor, a second NMOS transistor, and the inverter, wherein the first and second NMOS transistors form part of the latch circuit.

26. The scannable D flip-flop according to claim 19, wherein the output buffer comprises an inverter.

* * * * *

UNITED STATES PATENT AND TRADEMARK OFFICE
CERTIFICATE OF CORRECTION

PATENT NO. : 7,915,925 B2  Page 1 of 1
APPLICATION NO. : 12/270060
DATED : March 29, 2011
INVENTOR(S) : Gaojian Cong It is certified that error appears in the above-identified patent and that said Letters Patent is hereby corrected as shown below:

On the cover sheet, add item (30) as follows:

--(30)   Foreign Application Priority Data
  Sept. 26, 2008   (CN)..........................2008-10168567.4--.

Column 6, line 8, Claim 2, please delete "three".

Signed and Sealed this
Twenty-sixth Day of July, 2011

David J. Kappos
*Director of the United States Patent and Trademark Office*